(12) United States Patent (10) Patent No.: US 9,190,268 B2
Okuno et al. (45) Date of Patent: Nov. 17, 2015

(54) METHOD FOR PRODUCING GA-CONTAINING GROUP III NITRIDE SEMICONDUCTOR

(71) Applicant: TOYODA GOSEI CO., LTD., Kiyosu (JP)

(72) Inventors: Koji Okuno, Kiyosu (JP); Takahide Oshio, Kiyosu (JP); Naoki Shibata, Kiyosu (JP); Hiroshi Amano, Kiyosu (JP)

(73) Assignee: TOYODA GOSEI CO. LTD., Kiyosu-shi, Aichi-ken (JP)

( * ) Notice: Subject to any disclaimer, the term of this patent is extended or adjusted under 35 U.S.C. 154(b) by 0 days.

(21) Appl. No.: 13/784,600

(22) Filed: Mar. 4, 2013

(65) Prior Publication Data

US 2013/0260541 A1 Oct. 3, 2013

(30) Foreign Application Priority Data

Mar. 29, 2012 (JP) ................................ 2012-077882

(51) Int. Cl.
*H01L 21/20* (2006.01)
*H01L 21/02* (2006.01)

(52) U.S. Cl.
CPC ...... *H01L 21/02458* (2013.01); *H01L 21/0242* (2013.01); *H01L 21/0254* (2013.01); *H01L 21/0262* (2013.01)
USPC ................... 438/503; 438/478; 257/E21.108

(58) Field of Classification Search
USPC ........................ 438/503, 478, 492, 493, 497
See application file for complete search history.

(56) References Cited

U.S. PATENT DOCUMENTS 6,537,513 B1 * 3/2003 Amano et al. ............. 423/328.2
6,713,789 B1 3/2004 Shibata et al.
7,919,791 B2 * 4/2011 Flynn et al. .................. 257/194

(Continued)

FOREIGN PATENT DOCUMENTS

JP 2000-286202 A 10/2000
JP 2002-145700 A 5/2002

(Continued)

OTHER PUBLICATIONS

Japanese Office Action dated Aug. 20, 2014 with an English translation thereof.

(Continued)

*Primary Examiner* — Reema Patel
(74) *Attorney, Agent, or Firm* — McGinn IP Law Group PLLC

(57) ABSTRACT

A method for producing a Ga-containing group III nitride semiconductor having reduced threading dislocation is disclosed. A buffer layer in a polycrystal, amorphous or polycrystal/amorphous mixed state, comprising AlGaN is formed on a substrate. The substrate having the buffer layer formed thereon is heat-treated at a temperature higher than a temperature at which a single crystal of a Ga-containing group III nitride semiconductor grows on the buffer layer and at a temperature that the Ga-containing group III nitride semiconductor does not grow, to reduce crystal nucleus density of the buffer layer as compared with the density before the heat treatment. After the heat treatment, the temperature of the substrate is decreased to a temperature that the Ga-containing group III nitride semiconductor grows, the temperature is maintained, and the Ga-containing group III nitride semiconductor is grown on the buffer layer.

11 Claims, 4 Drawing Sheets

(56) References Cited

U.S. PATENT DOCUMENTS

| | | |
|---|---|---|
| 2002/0033521 A1 | 3/2002 | Matsuoka |
| 2004/0115917 A1 | 6/2004 | Shibata et al. |
| 2005/0042789 A1 | 2/2005 | Fujikura et al. |

FOREIGN PATENT DOCUMENTS

| | | |
|---|---|---|
| JP | 2005-019872 A | 1/2005 |
| JP | 2005-183524 A | 7/2005 |
| JP | 2009-147271 A | 7/2009 |
| WO | WO 2008/108381 A1 | 9/2008 |

OTHER PUBLICATIONS

Taiwanese Office Action dated Jan. 26, 2015 with a partial English translation thereof.

Japanese Office Action dated Feb. 24, 2015 with an English translation thereof.

* cited by examiner

METHOD FOR PRODUCING GA-CONTAINING GROUP III NITRIDE SEMICONDUCTOR

BACKGROUND OF THE INVENTION

1. Field of the Invention

The present invention relates to a method for producing a Ga-containing group III nitride semiconductor having reduced threading dislocation.

2. Description of the Related Art

A method of forming a low temperature buffer layer on a sapphire substrate by a metal organic chemical vapor deposition method (hereinafter referred to as an "MOCVD method") and growing GaN on the buffer layer has conventionally been known.

For example, in JP-A-2005-19872, a sapphire substrate is heat-treated at 1,135° C. to clean the surface thereof, a substrate temperature is decreased to 515° C., a buffer layer comprising GaN having a thickness of 20 nm is formed, the substrate temperature is increased to 1,075° C., and fine crystals of GaN are formed on the sapphire substrate. Thereafter, the temperature is maintained, hydrogen gas ratio is made larger than nitrogen gas ratio, and GaN is facet-grown using fine crystals of GaN as nuclei. Thereafter, the substrate temperature is decreased to 1,005° C., nitrogen gas ratio is made larger than hydrogen gas ratio, making it easy to grow in a horizontal direction, and GaN is grown so as to fill spaces among facets. Thus, GaN having reduced threading dislocation density is obtained.

In Example 3 of JP-A-2005-183524, a sapphire substrate is thermally cleaned at 1,200° C., a substrate temperature is set to 1,200° C., AlN is epitaxially grown, and a monocrystal underlying layer 102 having a thickness of 0.7 μm is formed. The substrate temperature is decreased to 1,150° C., an AlGaN layer 103 is epitaxially grown in a thickness of 100 nm or less, and an annealing treatment is conducted by maintaining the substrate temperature at 1,350° C. for 10 minutes. The substrate temperature is then decreased to 1,150° C., and an AlGaN layer 104 is grown. Thus, threading dislocation density of the AlGaN layer is reduced.

However, the method of JP-A-2005-19872 is a method that after forming a low temperature buffer layer comprising ultra thin GaN having a thickness of 20 nm at low temperature, the temperature is increased to a temperature capable of growing GaN to form fine crystals of GaN, and subsequently, GaN is facet-grown. Therefore, after formation of the low temperature buffer layer, the temperature of the substrate is merely increased up to a temperature capable of growing GaN, and therefore, crystal nuclei of fine crystals are small. As a result, density of occurrence origin of threading dislocation is still large.

The method of JP-A-2005-183524 is that an underlying layer 12 on a substrate 11 is epitaxially grown in a thickness of 0.7 μm, and is therefore fine crystal. Furthermore, the AlGaN layer 103 is epitaxially grown on the underlying layer 102 of fine crystal, and is therefore fine crystal. Annealing at a stage that the AlGaN layer 103 has been formed facilitates movement of dislocation in the AlGaN layer 103, thereby reducing threading dislocation (paragraph 0032).

Therefore, P-A-2005-183524 does not increase crystal nuclei in a buffer layer in a polycrystal, amorphous or polycrystal/amorphous mixed state, and does not inhibit formation of threading dislocation density in an objective semiconductor layer to be grown.

JP-A-2005-19872 relates to a heat treatment for obtaining crystal nuclei for facet growth, and does not decrease density of occurrence origin of threading dislocation.

SUMMARY OF THE INVENTION

The present invention has an object to uniform and decrease threading dislocation density of the objective semiconductor to be grown by reducing density of occurrence origin of threading dislocation.

A first invention is a method for growing a group III nitride semiconductor on a substrate comprising a material different from the group III nitride semiconductor, the method comprising:

forming a buffer layer in a polycrystal, amorphous or a mixed state of polycrystal and amorphous, the buffer layer comprising AlN or $Al_xGa_{1-x}N$ ($0<x<1$) on the substrate;

heat-treating the substrate having the buffer layer formed thereon at a temperature higher than a temperature at which a single crystal of a Ga-containing group III nitride semiconductor grows on the buffer layer and at a temperature that the Ga-containing group III nitride semiconductor does not grow, to reduce crystal nucleus density of the buffer layer as compared with the density before the heat treatment;

after the heat-treating, decreasing the temperature of the substrate to a temperature that the single crystal of the Ga-containing group III nitride semiconductor grows, and maintaining the temperature; and growing the Ga-containing group III nitride semiconductor on the buffer layer by an MOCVD method.

The buffer layer is AlN or $Al_xGa_{1-x}N$ ($0<x<1$). The heat treatment temperature is desirably 1,250° C. or higher. When the heat treatment temperature falls within this range, the temperature is higher than a temperature at which the single crystal of the Ga-containing group III nitride semiconductor grows, and the semiconductor does not grow at all. The heat treatment temperature is desirably a range of from 1,250 to 1,700° C. Where the heat treatment temperature exceeds 1,700° C., damage occurs in a substrate such as sapphire, and this is not desirable. The heat treatment temperature may be from 1,300 to 1,500° C. The buffer layer may be formed by sputtering, and may be formed by an MOCVD method. In the case that the buffer layer is formed by an MOCVD method, a substrate temperature is desirably from 300 to 600° C. Thickness of the buffer layer is desirably from 1 to 100 nm. When the formation temperature is from 300 to 600° C. and AlN or AlGaN is deposited in a thickness of the above range, polycrystal, amorphous or a mixed state of polycrystal and amorphous mixed state is formed. This state becomes a state of a low temperature formed buffer layer for epitaxially growing a group III nitride semiconductor on a different kind of a substrate.

The heat treatment is desirably conducted in the state of flowing hydrogen gas and ammonia gas. When the buffer layer in this state is heated to 1,250° C. or higher, adjacent crystal grains coalesce with each other by solid phase growth to form large crystal grains. Specifically, the buffer layer becomes an aggregate of crystal nuclei of larger single crystals. The Ga-containing group III nitride semiconductor to be epitaxially grown on the buffer layer conforms to a lattice of the crystal nucleus and epitaxially grows. Because semiconductors that grow coalesce in a grain boundary of a crystal nucleus, threading dislocation easily occurs in the grain boundary. However, because crystal nuclei are large, density of occurrence origin of threading dislocation is decreased. As a result, the threading dislocation density in the semiconductor that grows can primordially be reduced.

The material of the substrate can use any material so long as it is a material capable of growing the group III nitride semiconductor. For example, sapphire, SiC, Si, ZnO and the like can be used as the substrate. The Ga-containing group III nitride semiconductor can be a quaternary AlGaInN, a ternary AlGaN or InGaN and a binary GaN, each having an optional composition ratio but containing Ga as the essential component. In those semiconductors, a part of Al, Ga and In may be substituted with B or Tl that are group 13 elements (group 3B elements), and a part of N may be substituted with P, As, Sb and Bi that are group 15 elements (group 5B elements). Those semiconductors may contain n-type impurities and p-type impurities. Si is generally used as the n-type impurities, and Mg is generally used as the p-type impurities.

According to the present invention, AlN or $Al_xGa_{1-x}N$ ($0<x<1$) is deposited on a substrate to form a buffer layer in a polycrystal, amorphous or a mixed state of polycrystal and amorphous, heat treatment is conducted at a temperature higher than a temperature at which a single crystal of a Ga-containing group III nitride semiconductor grows on the buffer layer and at a temperature that the semiconductor does not grow, to reduce crystal nucleus density of the buffer layer as compared with the density before the heat treatment. As a result, the Ga-containing group III nitride semiconductor for the purpose of crystal growth conforms to a lattice, and crystal nuclei to be grown become large, thereby grain boundary density is reduced. As a result, density of occurrence origin of threading dislocation is decreased. As a result, the threading dislocation density in the semiconductor obtained can primordially be reduced.

DESCRIPTION OF THE PREFERRED EMBODIMENTS

Specific examples of the present invention are described below by reference to the drawings, but the invention is not construed as being limited to the examples.

Example 1

This example is an example that a buffer layer comprising AlN was formed on a sapphire substrate having c surface as a principal surface by an MOCVD method, and after heat treatment, GaN was grown. The crystal growth method is a metal organic chemical vapor deposition method (MOCVD method). A gas used is as follows. Hydrogen or nitrogen ($H_2$ or $N_2$) was used as a carrier gas, ammonia gas ($NH_3$) was used as a nitrogen source, trimethyl gallium ($Ga(CH_3)_3$: hereinafter referred to as "TMG") was used as a Ga source, and trimethyl aluminum ($Al(CH_3)_3$: hereinafter referred to as "TMA") was used as an Al source.

Change of crystal nucleus by heat treatment of a buffer layer is described. A sapphire substrate was placed in an MOCVD apparatus, a substrate temperature was increased to 1,180° C. from room temperature while flowing hydrogen gas, thereby heating and cleaning the sapphire substrate, and attached matters on the surface of the sapphire substrate were removed. The substrate temperature was set to 400° C. by an MOCVD method, TMA and ammonia gas were flown together with hydrogen gas, and a 10 nm thick buffer layer comprising AlN was formed on the sapphire substrate. Supply of TMG was stopped, the substrate temperature was increased to heat treatment temperature while flowing hydrogen gas (carrier gas) and ammonia gas, and the state was maintained for 2 minutes to conduct heat treatment of the buffer layer.

Figure 1:
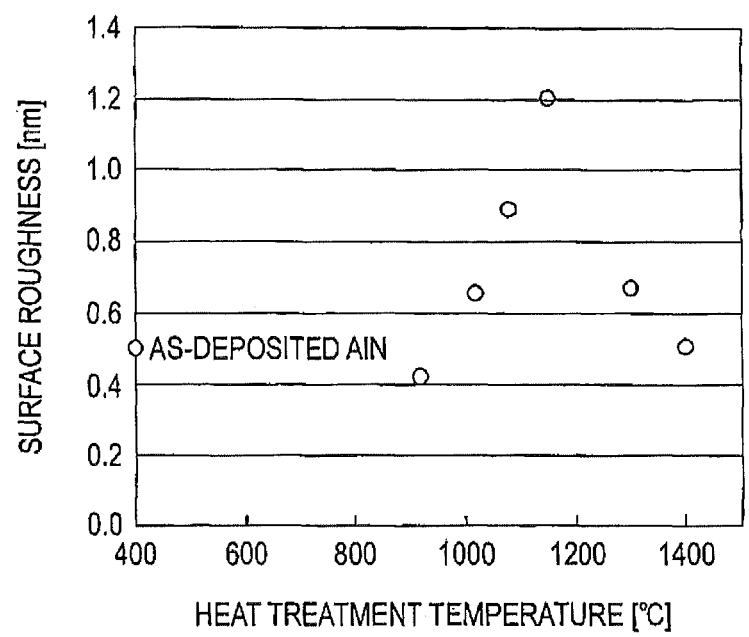
FIG. 1 is a characteristic diagram showing the relationship between surface roughness of the buffer layer and heat treatment temperature by the production method according to the examples of the present invention.
Figure 2:
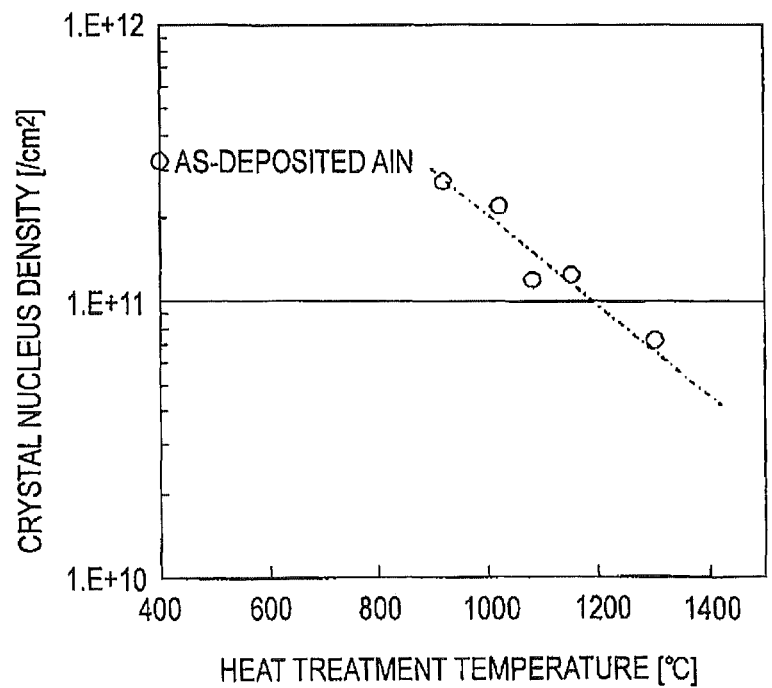
FIG. 2 is a characteristic diagram showing the relationship between crystal nucleus density of the buffer layer and heat treatment temperature by the production method according to the examples of the present invention.

Various samples were produced by changing the heat treatment temperature of the buffer layer to 400° C., 920° C., 1,020° C., 1,080° C., 1,150° C., 1,300° C. and 1,400° C. AFM image of the surface of the buffer layer after the heat treatment was measured. The relationship between surface roughness of the buffer layer and the heat treatment temperature was measured from the AFM image. The results obtained are shown in FIG. 1. Furthermore, the relationship between crystal nucleus density of the buffer layer and the heat treatment temperature was measured. The results obtained are shown in FIG. 2. The surface roughness is as follows. Average values of height of convex portions and depth of concave portions were obtained, and the surface roughness was indicated as root-mean-square (rms) of deviation to the average values of height of convex portions and depth of concave portions. It is seen from FIGS. 1 and 2 that when the heat treatment temperature falls within a range of from 400 to 1,150° C., surface roughness is increased with increasing the temperature. On the other hand, it is seen from FIGS. 1 and 2 that when the heat treatment temperature is 1,300° C. or higher, the surface roughness of the buffer layer is decreased to 0.68 nm or less that is close to the surface roughness (0.5 nm) when the buffer layer was formed. It is further seen that the crystal nucleus density is decreased in an exponential function with increasing the heat treatment temperature. It is seen that when the heat treatment temperature is 1,300° C. or higher, the crystal nucleus density is decreased to $7\times10^{10}/cm^2$ or less. Furthermore, according to the AFM image, the respective crystal nuclei become large with increasing the heat treatment temperature, and the crystal nucleus density is decreased. Particularly, as compared with the case that the buffer layer was formed at 400° C., in the case that the heat treatment temperature is 1,300° C. and 1,400° C., crystal nucleus remarkably becomes large, and the crystal nucleus density was remarkably decreased. It was seen from the above facts that the heat treatment temperature is 1,250° C. or higher, and desirably 1,300° C. or higher.

Figure 3:
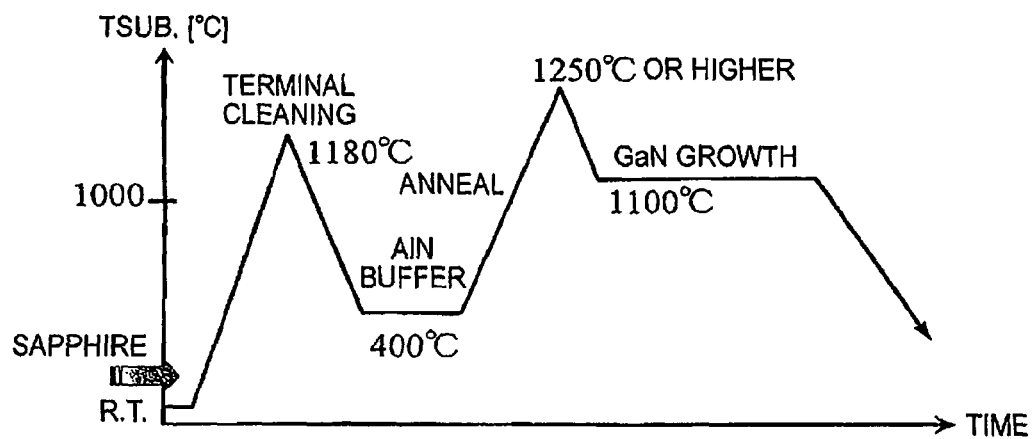
FIG. 3 is a characteristic diagram showing change of temperature of a substrate during growing by the production method according to the examples of the present invention.

After heat-treating the buffer layer at 1,300° C. for 2 minutes, GaN was grown on the buffer layer. FIG. 3 shows time change of control temperature of a sapphire substrate when growing a semiconductor. After heat-treating the buffer layer comprising AlN at 1,300° C. that is 1,250° C. or higher, the substrate temperature was decreased to 1,100° C. from 1,300° C., TMG and ammonia gas that are raw material gases were flown while flowing hydrogen gas as a carrier gas to grow into 3 μm thick GaN free of impurities. Because the crystal nucleus density of the buffer layer was reduced, occurrence origin density of threading dislocation is reduced, and as a result, threading dislocation in GaN grown on the buffer layer is decreased.

The formation temperature of the buffer layer was 400° C., but the buffer layer is in a polycrystal, amorphous or a mixed state of polycrystal and amorphous in a temperature range of from 300 to 600° C., and therefore, the temperature range can be used. The thickness of the buffer layer was 10 nm, but can be a range of from 1 to 100 nm. When the thickness falls within this range, the buffer layer can be made in a polycrystal, amorphous or a mixed state of polycrystal and amorphous.

Figure 4:
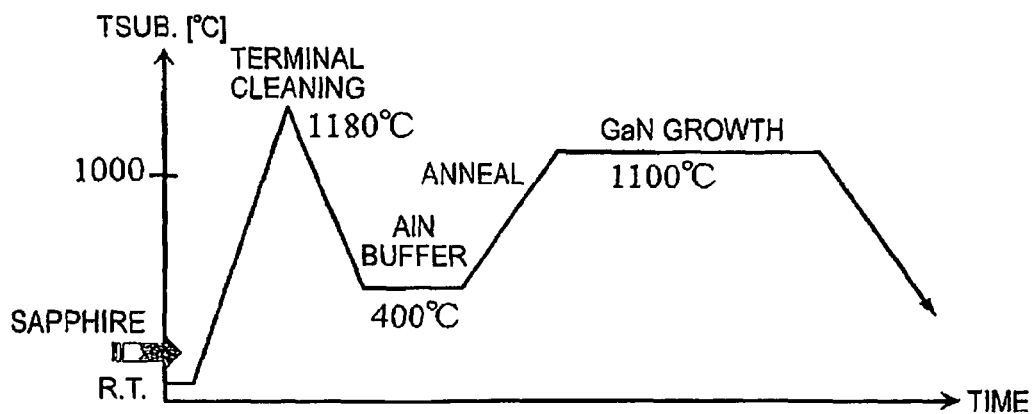
FIG. 4 is a characteristic diagram showing change of temperature of a substrate during growing by the conventional production method.

The present invention is not that the substrate temperature is increased from lower temperature forming a buffer layer to a temperature of 1,100° C. at which a Ga-containing group III nitride semiconductor to be grown on the buffer layer grows, and the Ga-containing group III nitride semiconductor is grown at the temperature, as shown in FIG. 4. The present invention is that before growing the Ga-containing group III nitride semiconductor, the temperature of the buffer layer is increased to a temperature at which a single crystal of Ga-containing group III nitride semiconductor cannot grow, that is, a temperature that exceeds a temperature at which the single crystal can appropriately grow and that the semiconductor does not grow, and heat treatment is then conducted, as shown in FIG. 3. Therefore, as compared with the case of immediately growing the Ga-containing group III nitride semiconductor, crystal nucleus of the buffer layer becomes large, and crystal nucleus density is decreased. As a result, the density of occurrence origin of threading dislocation in the buffer layer is reduced, and the threading dislocation density of Ga-containing group III nitride semiconductor to be grown can be reduced. Therefore, when the heat treatment temperature of the buffer layer is a temperature higher than a temperature at which single crystal of Ga-containing group III nitride semiconductor to be grown on the buffer layer grows and is a temperature that the semiconductor does not grow, the threading dislocation density of the semiconductor to be grown can be reduced. From this standpoint, the heat treatment temperature is from 1,250 to 1,700° C., and desirably from 1,300 to 1,700° C. The heat treatment holding time is 2 minutes, but can be 1 second. The holding time is desirably a range of from 1 second to 3 hours.

The buffer layer can use $Al_xGa_{1-x}N$ (0<x<1) other than AlN. In the case that the Ga-containing group III nitride semiconductor to be grown on the buffer layer is AlGaN (0<x<1), the buffer layer is desirably $Al_xGa_{1-x}N$ (0<x<1) from the standpoint of lattice conformity. The temperature of growing the objective semiconductor AlGaN (0<x<1) in a form of a single crystal is 100° C. or higher, and is a temperature lower than the heat treatment temperature (for example, 1,300° C.) of the buffer layer. Pressure in a chamber of MOCVD is desirably lower than 100 kPa (ordinary pressures). The pressure is 50 kPa or lower, desirably 35 kPa or lower, and more desirably 20 kPa or lower. Organic metal gas containing Al has high reactivity. Therefore, reaction occurs before raw material gases reach a substrate, and a bonded product that does not contribute to crystal growth of the objective semiconductor is formed. For this reason, the pressure is desirably low. When the pressure is reduced pressure and flow rate of raw material gases is increased, a reaction before reaching a substrate is inhibited, and single crystal growth having high efficiency becomes possible on the substrate. GaN of the objective semiconductor may be grown after growing monocrystal AlGaN on the buffer layer comprising AlN. AlGaN between the layers buffers lattice mismatch between AlN and GaN in the buffer layer, and as a result, crystallinity of the objective GaN is further improved.

The buffer layer may be formed by sputtering. In this case, the substrate temperature is desirably from 300 to 600° C.

Figure 5:
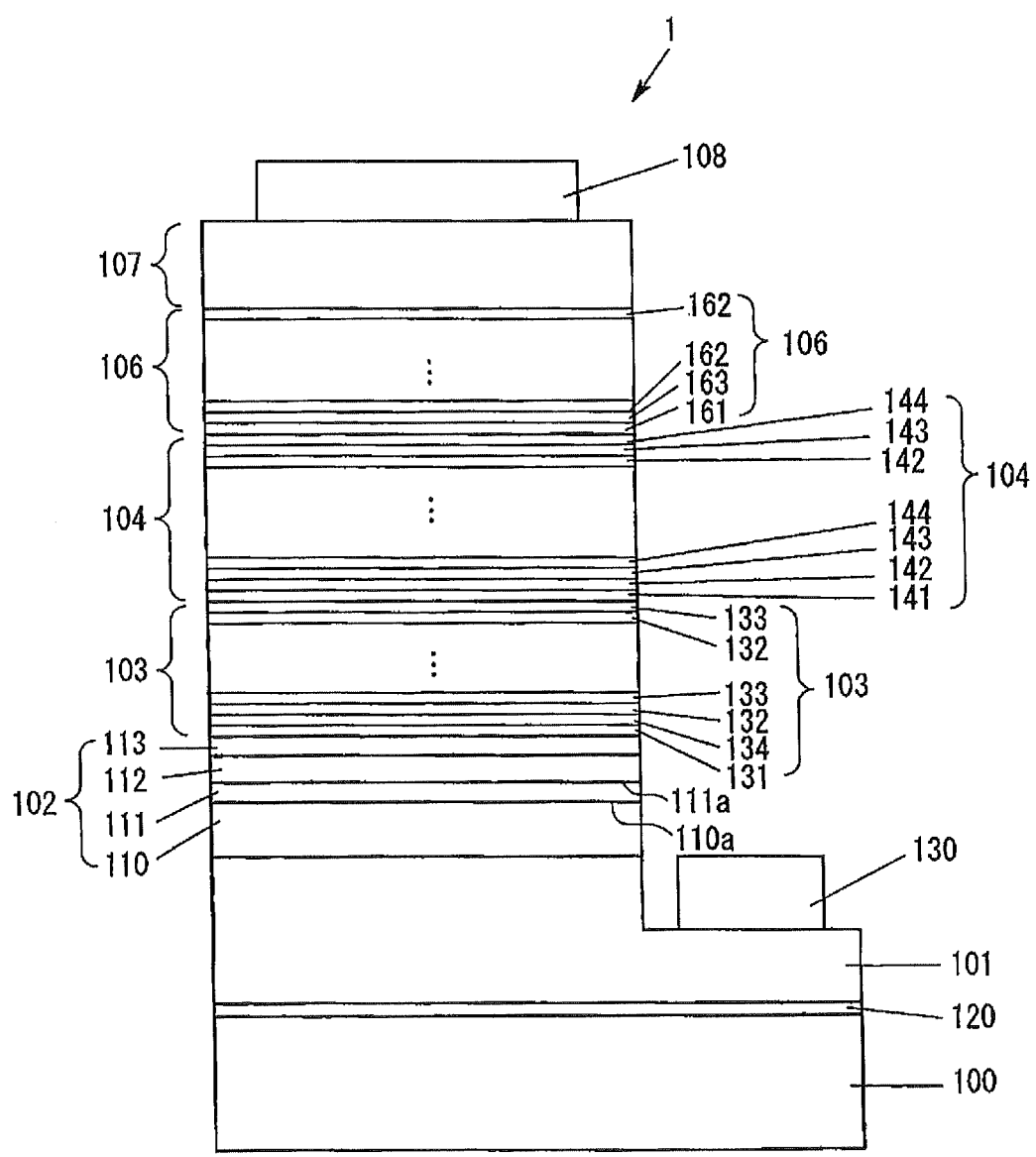
FIG. 5 is a structural drawing showing a light-emitting element produced by the production method according to the examples of the present invention.

A light-emitting element produced using the method of the present invention is described below. FIG. 5 is a view showing a constitution of a light-emitting element 1 using the production method of the present invention. The light-emitting element 1 has a structure that an n-type contact layer 101 comprising a group III nitride semiconductor, an ESD layer (an electric breakdown voltage improving layer) 102, an n-layer side clad layer (hereinafter referred to as an "n-type clad layer") 103, a light-emitting layer 104, a p-layer side clad layer (hereinafter referred to as a "p-type clad layer") 106, and a p-type contact layer 107 are laminated on a sapphire substrate 100 through a buffer layer 120 comprising AlN; a p-electrode is formed on the p-type contact layer 107; and an n-electrode 130 is formed on a partial region of the n-type contact layer 101, exposed by etching from the p-type contact layer 107 side.

The n-type contact layer 101 is n-GaN having Si concentration of $1 \times 10^{18}/cm^3$ or more. The n-type contact layer 101 has threading dislocation density of $5 \times 10^8/cm^2$ or less in a thickness of 1 μm or more. To achieve good contact with the n-electrode 130, the n-contact layer 101 may be constituted of a plurality of layers having different carrier concentration.

The ESD layer 102 has a four layer structure of a first ESD layer 110, a second ESD layer 111, a third ESD layer 112 and a fourth ESD layer 113, from the n-type contact layer 101 side. The first ESD layer 110 is n-GaN having Si concentration of from $1 \times 10^{16}$ to $1 \times 10^{17}/cm^3$. The ESD layer 110 has a thickness of from 200 to 1,000 nm.

The second ESD layer 111 is Si-doped GaN, and the characteristic value defined by the product of Si concentration ($/cm^3$) and a film thickness (nm) is from $0.9 \times 10^{20}$ to $3.6 \times 10^{20}$ ($nm/cm^3$). For example, in the case that the thickness of the second ESD layer 111 is 30 nm, the Si concentration is from $3.0 \times 10^{18}$ to $1.2 \times 10^{19}/cm^3$.

The third ESD layer 112 is non-doped GaN. The third ESD layer 112 has a thickness of from 50 to 200 nm. Although the third ESD layer is not doped, carrier concentration is from $1 \times 10^{16}$ to $1 \times 10^{17}/cm^3$ by residual carrier. The third ESD layer 112 may be doped with Si in a range that the carrier concentration is $5 \times 10^{17}/cm^3$ or less.

The fourth ESD layer is Si-doped GaN, and the characteristic value defined by the product of Si concentration ($/cm^3$) and a film thickness (nm) is from $0.9 \times 10^{20}$ to $3.6 \times 10^{20}$ ($nm/cm^3$). For example, in the case that the thickness of the fourth ESD layer 113 is 30 nm, the Si concentration is from $3.0 \times 10^{18}$ to $1.2 \times 10^{18}/cm^3$.

The n-type clad layer 103 has a superlattice structure that four layers of a non-doped $In_{0.077}Ga_{0.923}N$ layer 131 having a thickness of 4 nm, a non-doped GaN layer 134 having a thickness of 1 nm, a non-doped $Al_{0.2}Ga_{0.8}N$ layer 132 having a thickness of 0.8 nm and an Si-doped n-GaN layer 133 having a thickness of 1.6 nm are sequentially laminated, the resulting laminate constitutes one unit, and the unit structure is repeatedly laminated 15 times. However, the n-type clad layer 103 is that the layer firstly formed, that is, the layer contacting the fourth ESD layer 113, constitutes the $In_{0.077}Ga_{0.923}$ layer 131, and the layer finally formed; that is, the layer contacting the light-emitting layer 104, constitutes the n-GaN layer 133. The overall thickness of the n-clad layer 103 is 111 nm. The thickness of the $In_{0.077}Ga_{0.923}$ layer 131 can be from 1.5 to 5.0 nm. The thickness of the non-doped GaN layer 134 can be from 0.3 to 2.5 nm. The GaN layer may be doped with Si. The thickness of the $Al_{0.2}Ga_{0.8}N$ layer 132 can be from 0.3 to 2.5 nm. The thickness of the n-GaN layer can be from 0.3 to 2.5 nm.

The light-emitting layer 104 (alternatively called an "active layer") has an MQW structure that four layers of an $Al_{0.05}Ga_{0.95}N$ layer 141 having a thickness of 2.4 nm, an $In_{0.2}Ga_{0.8}N$ layer 142 having a thickness of 3.2 nm, a GaN layer 143 having a thickness of 0.6 nm and an $Al_{0.2}Ga_{0.8}N$ layer 144 having a thickness of 0.6 nm are sequentially laminated, the resulting laminate constitutes one unit, and the unit structure is repeatedly laminated 8 times. However, the light-emitting layer 104 is that the layer firstly formed, that is, the layer contacting the n-type clad layer 103, constitutes the $Al_{0.05}Ga_{0.95}$ layer 141, and the layer finally formed, that is, the layer contacting a p-type clad layer 105, constitutes the $Al_{0.2}Ga_{0.8}N$ layer 144. The overall thickness of the light-emitting layer 104 is 54.4 nm. All layers constituting the light-emitting layer 104 are non-doped layers.

The p-type clad layer 106 has a structure that a p-$In_{0.05}Ga_{0.95}N$ layer 161 having a thickness of 1.7 nm and a p-$Al_{0.3}Ga_{0.7}N$ layer 162 having a thickness of 3.0 nm are sequentially laminated, the resulting laminate constitutes one unit, and the unit structure is repeatedly laminated 7 times. However, the layer firstly formed, that is, the layer contacting the light-emitting layer 104, constitutes the p-$In_{0.05}Ga_{0.95}N$ layer 161, and the layer finally formed, that is, the layer contacting the p-type contact layer 107, constitutes the p-$Al_{0.3}Ga_{0.7}N$ layer 162. The overall thickness of the p-type clad layer 106 is 32.9 nm. Mg is used as p-type impurities.

The p-type contact layer 107 is an Mg-doped p-GaN. To achieve good contact with the p-electrode, the p-type contact layer 107 may be constituted of a plurality of layers having different carrier concentration.

Figure 6:
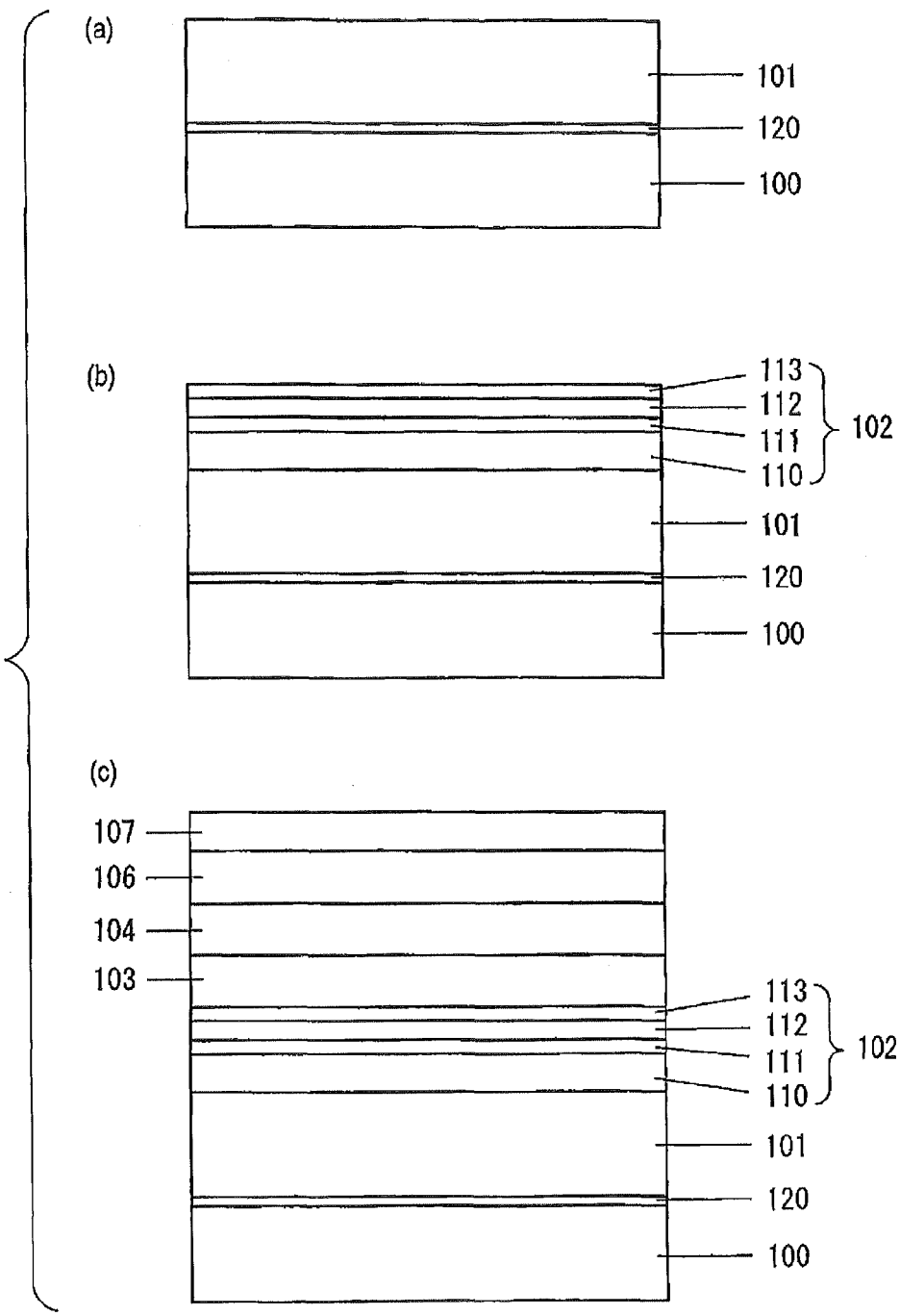
FIG. 6 is a cross-sectional view of an element showing the production process of a light-emitting element.

Production method of the light-emitting element 1 is described below by reference to FIG. 6. Indication of periodic structure of the superlattice shown in FIG. 5 is omitted in FIG. 6.

The crystal growth method used is a metal organic chemical vapor deposition method (MOCVD method). The gases used were as follows. Hydrogen or nitrogen ($H_2$ or $N_2$) was used as a carrier gas, ammonia gas ($NH_3$) was used as a nitrogen source, trimethyl gallium ($Ga(CH_3)_3$: hereinafter referred to as "TMG") was used as a Ga source, trimethyl indium ($In(CH_3)_3$); hereinafter referred to as "TMI") was used as an In source, trimethyl aluminum ($Al(CH_3)_3$: hereinafter referred to as "TMA") was used as an Al source, silane ($SiH_4$) was used as an n-type dopant gas, and cyclopentadienyl magnesium ($Mg(C_5H_5)_2$; hereinafter referred to as "$CP_2Mg$") was used as a p-type dopant gas.

The sapphire substrate 100 was heated in a hydrogen atmosphere to conduct cleaning, and attached matters on the surface of the sapphire substrate 100 were removed. Using an MOCVD method, TMA and ammonia gas were flown together with a carrier gas, the substrate temperature was set to 400° C., and the buffer layer 120 comprising AlN was formed on the sapphire substrate 100. Supply of TMA was stopped, the substrate temperature was increased to 1,300° C. while flowing hydrogen gas (a carrier gas) and ammonia gas, the state was held for 2 minutes, and the buffer layer was heat-treated. The substrate temperature was decreased to 1,100° C., and when the temperature reached 1,100° C., the n-type contact layer 101 comprising GaN having Si concentration of $4.5 \times 10^{18}$ $cm^{-3}$ was immediately formed on the buffer layer 120 using TMG and ammonia gas as raw material gases and using silane gas as an impurity gas (FIG. 6(a)). Threading dislocation density of the n-type contact layer 101 is $5 \times 10^8/cm^2$ or less in a thickness of 1 μm or more.

The ESD layer was formed in the following manner. The first ESD layer 110 that is n-GaN having a thickness of from 200 to 1,000 nm and Si concentration of from $1 \times 10^{16}$ to $5 \times 10^{17}/cm^3$ was formed on the n-type contact layer 101 by an MOCVD method. The growth temperature was set to 900° C. or higher so as to obtain good quality crystal having low pit density. When the growth temperature is 1,000° C. or higher, better quality crystal is obtained, which is desirable.

The second ESD layer 111 that is n-GaN having the characteristic value defined by the product of Si concentration ($/cm^3$) and a film thickness (nm) of from $0.9 \times 10^{20}$ to $3.6 \times 10^{20}$ ($nm/cm^3$) was formed on the first ESD layer 110 by an MOCVD method. The growth temperature was set to from 800 to 950° C. The third ESD layer 112 that is non-doped GaN having a thickness of from 50 to 200 nm was formed on the second ESD layer 111 by an MOCVD method. The growth temperature was set to from 800 to 950° C. so as to obtain crystal having a carrier concentration of $5 \times 10^{17}/cm^3$ or less.

The fourth ESD layer 113 that is n-GaN having the characteristic value defined by the product of Si concentration ($/cm^3$) and a film thickness (nm) of from $0.9 \times 10^{20}$ to $3.6 \times 10^{20}$ ($nm/cm^3$) was formed on the third ESD layer 112 by an MOCVD method. The growth temperature was set to from 800 to 950° C. The ESD layer 102 was formed on the n-type contact layer 101 by the above steps (FIG. 6(b)).

The n-type clad layer 103 was formed on the ESD layer 102 by an MOCVD method. Periodic structure comprising a non-doped $In_{0.077}Ga_{0.923}N$ layer 131 having a thickness of 4 nm, a non-doped $Al_{0.2}Ga_{0.8}N$ layer 132 having a thickness of 0.8 nm and an Si-doped n-GaN layer 133 having a thickness of 1.6 nm, that are layers constituting the n-type clad layer 103 was repeatedly formed 15 cycles. The $In_{0.077}Ga_{0.923}N$ layer 131 was formed by setting the substrate temperature to 830° C. and supplying silane gas, TMG, TMI and ammonia. The non-doped GaN layer 134 was formed by setting the substrate temperature to 830° C. and supplying TMG and ammonia. The $Al_{0.2}Ga_{0.8}N$ layer 132 was formed by setting the substrate temperature to 830° C. and supplying TMA, TMG and ammonia. The n-GaN layer 133 was formed by setting the substrate temperature to 830° C. and supplying TMG and ammonia.

The light-emitting layer 104 was formed on the n-type clad layer 103. The light-emitting layer 104 was formed by repeating periodic structure of four layers of the $Al_{0.05}Ga_{0.95}N$ layer 141, the $In_{0.2}Ga_{0.8}N$ layer 142, the GaN layer 143 and the $Al_{0.2}Ga_{0.8}N$ layer 144 that are layers constituting the light-emitting layer 104 eight times. The growth temperature of the $Al_{0.05}Ga_{0.95}N$ layer 141 was set to an optional temperature in a range of from 800 to 950° C., the growth temperature of the $In_{0.2}Ga_{0.8}N$ layer 142, the GaN layer 143 and the $Al_{0.2}Ga_{0.8}N$ layer 144 was set to 770° C. In the growth of each layer, the substrate temperature growing each layer may be set to a constant temperature of 770° C. The respective raw material gases were supplied to form the light-emitting layer 104.

The n-type clad layer 106 was formed on the light-emitting layer 104. The p-$In_{0.05}Ga_{0.95}N$ layer 161 was formed in a thickness of 1.7 nm by setting the substrate temperature to 855° C. and supplying $CP_2Mg$, TMI, TMG and ammonia, the p-$Al_{0.3}Ga_{0.7}N$ layer 162 was formed in a thickness of 3.0 nm by setting the substrate temperature to 855° C. and supplying $CP_2Mg$, TMA, TMG and ammonia, and those procedures were repeated 7 times to laminate those layers.

The p-type contact layer 107 having a thickness of 50 nm, comprising a p-type GaN doped with Mg in an amount of $1 \times 10^{20}$ $cm^{-3}$ was formed on the p-type clad layer 106 by setting the substrate temperature to 1,000° C. and using MG ammonia and CP$_2$Mg. Thus, an element structure shown in FIG. 6(c) was formed. Mg concentration in the p-type contact layer 107 can be used in a range of from 1×10$^{19}$ to 1×10$^{21}$ cm$^3$. The thickness of the p-type contact layer 107 may be a range of from 10 to 100 nm.

After activating Mg by heat treatment, dry etching was conducted from the surface side of the p-type contact layer 107 to form a groove reaching the n-type contact layer 101. The p-electrode 108 comprising Rh/Ti/Au (a structure laminated in this order from the p-type contact layer 107 side) was formed on the surface of the p-type contact layer 107, and the n-electrode 130 comprising V/Al/Ti/Ni/Ti/Au (a structure laminated in this order from the n-type contact layer 101 side) was formed on the n-type contact layer 101 exposed on the grove bottom by dry etching. Thus, the light-emitting element 1 shown in FIG. 5 was produced.

The present invention can be used in a production method of a group III nitride semiconductor light-emitting element.

What is claimed is:

1. A method for growing a group III nitride semiconductor on a sapphire substrate, the method comprising:
   forming a buffer layer in a polycrystal, amorphous or a mixed state polycrystal and amorphous, the buffer layer comprising AlN or Al$_x$Ga$_{1-x}$N (0<x<1) on the substrate, the buffer layer having a thickness of from 1 to 100 nm;
   heat-treating the substrate having the buffer layer formed thereon at a temperature within a range of 1300° C. to 1700° C., at which a single crystal of the Ga-containing group III nitride semiconductor does not grow, higher than a temperature at which the single crystal of the Ga-containing group III nitride semiconductor grows on the buffer layer to coalesce adjacent crystal grains with each other by solid phase growth to form large crystal grains, the heat treatment being conducted in a state of flowing hydrogen gas and ammonia gas, so that a surface roughness of the buffer layer, expressed in standard deviation of a height of convex portions and depth of concave portions of the buffer layer, becomes 0.68 nm or less, and, so as to reduce crystal nucleus density of the buffer layer as compared with the density before the heat treatment;
   after the heat-treating, decreasing the temperature of the substrate to a temperature that the single crystal of the Ga-containing group III nitride semiconductor grows, and maintaining the temperature; and
   growing the Ga-containing group III nitride semiconductor on the buffer layer by an MOCVD method.

2. The method for growing a group III nitride semiconductor according to claim 1, wherein the buffer layer is formed at a substrate temperature in a range of from 300 to 600° C. by an MOCVD method.

3. The method for growing a group III nitride semiconductor according to claim 1, wherein the buffer layer is formed by sputtering.

4. The method for growing a group III nitride semiconductor according to claim 1, wherein the Ga-containing group III nitride semiconductor includes GaN.

5. The method for growing a group III nitride semiconductor according to claim 1, wherein said heat-treating the substrate having the buffer layer formed thereon at a temperature within the range of 1300° C. to 1700° C. is performed for at least 2 minutes.

6. The method for growing a group III nitride semiconductor according to claim 1, wherein said heat-treating the substrate having the buffer layer formed thereon at a temperature within the range of 1300° C. to 1700° C. is performed for less than 3 hours.

7. The method for growing a group III nitride semiconductor according to claim 1, wherein a pressure in a chamber of the MOCVD method is less than 100 kPa.

8. The method for growing a group III nitride semiconductor according to claim 1, wherein a pressure in a chamber of the MOCVD method is less than 50 kPa.

9. The method for growing a group III nitride semiconductor according to claim 1, wherein a pressure in a chamber of the MOCVD method is less than 20 kPa.

10. A light emitting diode comprising a group III nitride semiconductor on a sapphire substrate using the method of claim 1.

11. A method for growing a group III nitride semiconductor on a sapphire substrate, the method comprising:
    forming a buffer layer in a polycrystal, amorphous or a mixed state polycrystal and amorphous, the buffer layer comprising AlN or Al$_x$Ga$_{1-x}$N (0<x<1) on the substrate, the buffer layer having a thickness of from 1 to 100 nm;
    heat-treating the substrate having the buffer layer formed thereon at a temperature within a range of 1250° C. to 1700° C., at which a single crystal of the Ga-containing group III nitride semiconductor does not grow, higher than a temperature at which the single crystal of the Ga-containing group III nitride semiconductor grows on the buffer layer to coalesce adjacent crystal grains with each other by solid phase growth to form large crystal grains, the heat treatment being conducted in a state of flowing hydrogen gas and ammonia gas, so that a surface roughness of the buffer layer, expressed in standard deviation of a height of convex portions and depth of concave portions of the buffer layer, becomes 0.68 mm or less, and so as to reduce crystal nucleus density of the buffer layer as compared with the density before the heat treatment;
    after the heat-treating, decreasing the temperature of the substrate to a temperature that the single crystal of the Ga-containing group III nitride semiconductor grows, and maintaining the temperature; and
    growing the Ga-containing group III nitride semiconductor on the buffer layer by an MOCVD method.

* * * * *